(12) United States Patent
Hirata

(10) Patent No.: US 8,355,228 B2
(45) Date of Patent: Jan. 15, 2013

(54) SEMICONDUCTOR INTEGRATED CIRCUIT HAVING PROTECTION CIRCUIT CAPABLE OF PROTECTING AGAINST ESD AND EOS

(75) Inventor: Hajime Hirata, Chiba (JP)

(73) Assignee: Kawasaki Microelectronics Inc., Chiba (JP)

( * ) Notice: Subject to any disclaimer, the term of this patent is extended or adjusted under 35 U.S.C. 154(b) by 281 days.

(21) Appl. No.: 12/662,522

(22) Filed: Apr. 21, 2010

(65) Prior Publication Data

US 2010/0271739 A1 Oct. 28, 2010

(30) Foreign Application Priority Data

Apr. 28, 2009 (JP) ................................. 2009-109323

(51) Int. Cl.
*H02H 9/04* (2006.01)
(52) U.S. Cl. ......................................................... 361/56
(58) Field of Classification Search .................. None
See application file for complete search history.

(56) References Cited

U.S. PATENT DOCUMENTS

| | | | |
|---|---|---|---|
| 5,654,574 A | 8/1997 | Williams et al. | |
| 7,518,841 B2* | 4/2009 | Chuang et al. | 361/56 |
| 7,660,087 B2* | 2/2010 | Huang et al. | 361/56 |
| 7,672,103 B2* | 3/2010 | Moon | 361/56 |
| 8,120,884 B2* | 2/2012 | Zhang | 361/56 |
| 2005/0036251 A1* | 2/2005 | Mallikarjunaswamy et al. | 361/56 |
| 2008/0232010 A1* | 9/2008 | Wang et al. | 361/56 |
| 2010/0148797 A1* | 6/2010 | Ker et al. | 324/555 |
| 2010/0208398 A1* | 8/2010 | Jou | 361/56 |

* cited by examiner

*Primary Examiner* — Rexford Barnie
*Assistant Examiner* — Angela Brooks
(74) *Attorney, Agent, or Firm* — Oliff & Berridge, PLC

(57) ABSTRACT

A semiconductor integrated circuit has an internal circuit having an input terminal connected to a connection terminal, a protection circuit that discharges an over-voltage supplied to the connection terminal to a power line. The protection circuit includes a first discharge circuit connected to the connection terminal, a second discharge circuit connected to the connection terminal and discharges the over-voltage to the power line, and an over-voltage detect circuit that detects a discharge current flowing through the second discharge circuit and generates an over-voltage detect signal when the discharge current is detected. The first discharge circuit is disabled to discharge the over-voltage when the over-voltage detect signal is supplied.

15 Claims, 16 Drawing Sheets

US 8,355,228 B2

SEMICONDUCTOR INTEGRATED CIRCUIT HAVING PROTECTION CIRCUIT CAPABLE OF PROTECTING AGAINST ESD AND EOS

This application claims priority from Japanese Patent Application No. 2009-109323, filed on Apr. 28, 2009, which is hereby incorporated by reference in its entirety.

BACKGROUND

This disclosure relates to a semiconductor integrated circuit including internal circuit and a protection circuit configured to protect the internal circuit from over-voltages higher than an operation voltage of the internal circuit. This invention also relates to a method of protecting the semiconductor integrated circuit from the over-voltage.

Over-voltages applied to a connection terminal of a semiconductor integrated circuit include those caused by electrostatic discharge (ESD) and by electrical over-stress (EOS).

ESD is a phenomenon in which static electricity charged in a human body or the like is applied to a connection terminal of the semiconductor integrated circuit. As shown in FIG. 14, this causes a surge current of the order of several amperes to flow through the semiconductor integrated circuit for a short period of time of, for example, 1 μs or less.

EOS is a phenomenon that occurs when a ground of the semiconductor integrated circuit is separated from that of a tester used for testing the semiconductor integrated circuit. For example, during the rise of a power supply voltage of the semiconductor integrated circuit, a power supply voltage of 10 V to 20 V is applied to a connection terminal of the semiconductor integrated circuit for a relatively long period of time of, for example, several milliseconds to several seconds, as shown in FIG. 15.

ESD is caused by sudden discharge of electric charge, and its voltage rises in a pulse-like manner in a period of time shorter than that for EOS. EOS has a rise time longer than that of ESD and its voltage lasts for a longer period of time.

The semiconductor integrated circuit is usually equipped with an ESD protection device that turns on and discharges the over voltage. The ESD protection device may also turn on when EOS is applied. Then, a current of the order of amperes flows through the ESD protection device for several milliseconds to several seconds and may damage the ESD protection device. As a solution to this problem, U.S. Pat. No. 5,654,574 (Patent Document 1) proposes an ESD/EOS protection circuit that is equipped with separate protective measures against ESD and EOS, respectively.

FIG. 16 is a diagram illustrating an ESD/EOS protection circuit proposed in Patent Document 1.

An ESD/EOS protection circuit 200 illustrated in FIG. 16 includes high-voltage depletion type metal oxide semiconductor field-effect transistors (MOSFETs) 201 and 202 having parasitic diodes 201a and 202a, respectively. A gate and a source of the MOSFET 201 are connected in common to a connection terminal 203. A gate and a source of the MOSFET 202 are connected in common through a resistor 204 to an internal logic 210. Drains of the MOSFETs 201 and 202 are connected to each other and further connected to a cathode of a first diode 205. An anode of the first diode 205 is connected to a ground GND. A cathode of a second diode 206 is connected to a connection point between the resistor 204 and the internal logic 210. An anode of the second diode 206 is connected to the ground GND.

In a normal operating state of the semiconductor integrated circuit, the MOSFETs 201 and 202, both of which are depletion type MOSFETs, are in the ON state. Therefore, a signal input to the connection terminal 203 is transmitted through the path including the MOSFET 201, MOSFET 202, and the resistor 204 to the internal logic 210. In the normal operating state, because a potential of a signal supplied to the connection terminal 203 is low, the first and second diodes 205 and 206 are in the OFF state.

Increasing the voltage applied to the connection terminal 203 increases a reverse bias voltage of the first and second diodes 205 and 206, and causes the first and second diodes 205 and 206 to break down. Breakdown voltages Vt_rev1 and Vt_rev2 of the first and second diodes 205 and 206 are set such that a relationship of Vt_rev1>Vt_rev2 is satisfied.

Operations performed in the ESD/EOS protection circuit 200 when ESD is applied and when EOS is applied will be described.

FIG. 17 is a diagram for describing an operation performed in the ESD/EOS protection circuit 200 of FIG. 16 when ESD is applied. An ESD pulse that exceeds the breakdown voltage Vt_rev1 of the first diode 205 is applied to the connection terminal 203 illustrated in FIG. 17. This turns on, or breaks down, the first diode 205 and allows a surge current Iesd to flow through the current path including the MOSFET 201 and the first diode 205 to the ground GND.

FIG. 18 is a diagram for describing an operation performed in the ESD/EOS protection circuit 200 of FIG. 16 when EOS is applied. As an EOS voltage, a voltage between the breakdown voltage Vt_rev1 of the first diode 205 and the breakdown voltage Vt_rev2 of the second diode 206 is applied to the connection terminal 203. Because the relationship Vt_rev1>Vt_rev2 is satisfied, applying the EOS voltage turns on the second diode 206 only, and allows a current Ieos to flow through the current path including the MOSFET 201, the MOSFET 202, the resistor 204, and the second diode 206 to the ground GND.

Thus, as described above, the ESD/EOS protection circuit 200 is equipped with separate protective measures against ESD and EOS, respectively.

However, in the ESD/EOS protection circuit 200 proposed in Patent Document 1, an EOS voltage greater than the breakdown voltage Vt_rev1 of the first diode 205 may be applied to the connection terminal 203.

FIG. 19 is a diagram for describing an operation performed in the ESD/EOS protection circuit 200 of FIG. 16 when an EOS voltage greater than the breakdown voltage Vt_rev1 of the first diode 205 is applied. Applying such an EOS voltage turns on the first diode 205. Because the first diode 205 is configured to allow a surge current caused by ESD to flow, turning on the first diode 205 causes a large current to flow through the first diode 205. In other words, applying an EOS voltage greater than the breakdown voltage Vt_rev1 of the first diode 205 to the connection terminal 203 may damage the first diode 205, which is provided as an ESD protection device in the ESD/EOS protection circuit 200.

Increasing the breakdown voltage Vt_rev1 of the first diode 205 would decrease the risk of damaging the first diode 205. However, increasing the breakdown voltage of the first diode 205 may degrade the protection ability of the ESD/EOS protection circuit 200 against ESD. Additionally, because the breakdown voltages depend on the semiconductor manufacturing process, it is not easy to reduce variations of the breakdown voltages of the diodes among products.

SUMMARY

In order to address the problems described above, an exemplary object of this disclosure is to provide semiconductor integrated circuits capable of effectively protecting internal logics from both ESD and EOS. Another exemplary object of this disclosure is to provide methods of protecting internal logics of semiconductor integrated circuits from both ESD and EOS.

Exemplary embodiments according to this disclosure provide semiconductor integrated circuits, which include an internal circuit having an input terminal connected to a connection terminal, a protection circuit that discharges an over-voltage supplied to the connection terminal, which is higher than an operation voltage of the internal circuit, to a power line. The protection circuit includes a first discharge circuit connected to the connection terminal, a second discharge circuit connected to the connection terminal and discharges the over-voltage to the power line, and an over-voltage detect circuit that detects a discharge current flowing through the second discharge circuit and generates an over-voltage detect signal to be supplied to the first discharge circuit when the discharge current is detected. The first discharge circuit, which discharges the over-voltage when the over-voltage detect signal is not supplied, is disabled to discharge the over-voltage when the over-voltage detect signal is supplied.

According to various exemplary embodiments, the second discharge circuit may include a first resistor, through which the input terminal of the internal circuit is connected to the connection terminal, and a discharge device connected between the input terminal of the internal circuit and the power line.

According to various exemplary embodiments, the over-voltage detect circuit may include a detect device that detects the discharge current and generates the over-voltage detect signal, and a time-constant circuit having a time constant determined by a capacitor and a second resister. The time-constant circuit controls a rising time of the over-voltage detect signal.

According to various exemplary embodiments, the time-constant circuit may control the rising time of the over-voltage detect signal such that, when a first over-voltage having a first duration longer than the rising time of the over-voltage detect signal is supplied to the connection terminal, the first discharge circuit is disabled before the first discharge circuit is damaged by a first discharge current flowing through the first discharge circuit to discharge the first over-voltage.

According to various exemplary embodiments, the time-constant circuit may control the rising time of the over-voltage detect signal such that, when a second over-voltage having a second rising time shorter than the rising time of the over-voltage detect signal is supplied to the connection terminal, the first discharge circuit discharges the second over-voltage.

Exemplary embodiments according to this disclosure provide methods of protecting semiconductor integrated circuits from an over-voltage. The methods include providing a first discharge circuit connected to the connection terminal, providing a second discharge circuit connected to the connection terminal and discharging the over-voltage through the second discharge circuit to a power line, detecting a discharge current flowing through the second discharge circuit and generating a over-voltage detect signal when the discharge current is detected. The method further includes supplying the over-voltage detect signal to the first discharge circuit, which discharges the over-voltage when the over-voltage detect signal is not supplied, and disabling the first discharge circuit to discharge the over-voltage.

BRIEF DESCRIPTION OF DRAWINGS

Various exemplary details of semiconductor integrated circuit and methods of protecting semiconductor integrated circuits are described with reference to the following figures, wherein.

DETAILED DESCRIPTION OF EMBODIMENTS

Figure 1:
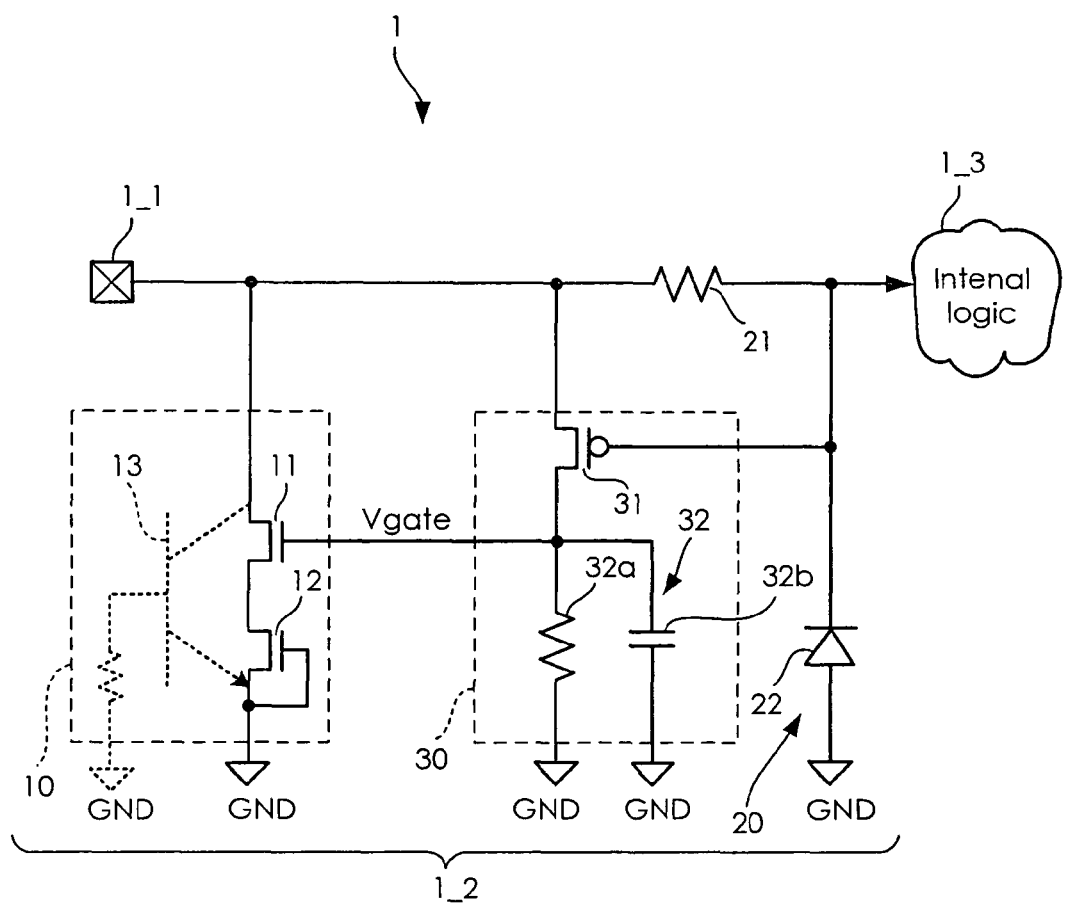
FIG. 1 illustrates a configuration of an exemplary semiconductor integrated circuit according to a first exemplary embodiment of this disclosure.

FIG. 1 illustrates a configuration of an exemplary semiconductor integrated circuit according to a first exemplary embodiment of this disclosure.

The exemplary semiconductor integrated circuit 1 illustrated in FIG. 1 includes a connection terminal (pad) 1_1, a protection circuit 1_2, and an internal circuit having an internal logic 1_3. The exemplary semiconductor integrated circuit 1 has a plurality of connection terminals including the connection terminal 1_1. Through the connection terminals, signals are input and output between the internal circuit including the internal logic 1_3 and external devices.

The protection circuit 1_2 is a circuit that protects the internal logic 1_3 from over-voltages higher than an operation voltage of the internal logic, or a voltage of a signal supplied to the connection terminal 1_1 in the normal operation. An exemplary configuration of the protection circuit 1_2 will be described.

The protection circuit 1_2 may include a first discharge circuit 10, a second discharge circuit 20, and an over-voltage detect circuit 30.

The first discharge circuit 10 may include two cascaded MOS transistors between the connection terminal 1_1 and a ground power line GND. Specifically, the first discharge circuit 10 may include a first N-channel MOS transistor 11 and a second N-channel MOS transistor 12. The first N-channel MOS transistor 11 is connected at its drain to the connection terminal 1_1. The second N-channel MOS transistor 12 is connected at its source and gate to the ground GND and is connected at its drain to the source of the first N-channel MOS transistor 11.

As indicated by a dotted line, a parasitic bipolar transistor 13 is formed in the first discharge circuit 10. The bipolar transistor 13 has the drain of the first N-channel MOS transistor 11 as a collector, the source of the second N-channel MOS transistor 12 as an emitter, and a common substrate region of the first and the second N-channel MOS transistors as a base.

The second discharge circuit 20 may include a resistor 21 and a diode 22. The resistor 21 is connected between the connection terminal 1_1 and the internal logic 1_3. The diode 22 is connected at its cathode to a connection point between the resistor 21 and the internal logic 1_3 and is connected at its anode to the ground GND. A reverse current flows through the diode 22 when a voltage greater than or equal to a breakdown voltage of the diode 22 is applied to the connection terminal 1_1. Accordingly, when EOS is applied to the connection terminal 1_1, the diode 22 allows a current to flow from the connection terminal 1_1 through the resistor 21 to the ground GND.

The current that flows through the diode 22 when EOS is applied is limited by the resistor 21. Therefore, the diode 22 is not damaged even when EOS is continuously applied.

The over-voltage detect circuit 30 includes a P-channel MOS transistor 31 and a time-constant circuit 32. The source of the P-channel MOS transistor 31 is connected to a terminal of the resistor 21, which is connected to the connection terminal 1_1, and the gate of the P-channel MOS transistor 31 is connected to another terminal of the resistor 21, which is connected to the input terminal of the internal logic 1_3. Accordingly, the P-channel MOS transistor 31 detects a voltage drop across the resistor 21 that is developed when the diode 22 breaks down and allows a current to flow through the resistor 21, and generates an over-voltage detect signal.

The time-constant circuit 32 includes a resistor 32a and a capacitor 32b that are connected in parallel between a drain of the P-channel MOS transistor 31 and the ground GND. A resistance value of the resistor 32a and a capacitance value of the capacitor 32b, which determine the time constant of the time-constant circuit, are set such that the time constant is longer than the rise time of ESD and shorter than the rise time of EOS.

The drain of the P-channel MOS transistor 31 is connected to the time-constant circuit 32 and also to the gate of the first N-channel MOS transistor 11 included in the first discharge circuit 10. A gate voltage Vgate serving as an over-voltage detect signal is generated at the drain of the P-channel MOS transistor 31 and supplied to the gate of the first N-channel MOS transistor 11. The time-constant circuit 32 controls a rise time of the over-voltage detect signal.

As described above, ESD rises more abruptly than EOS. By setting the CR time constant of the time-constant circuit 32 in the manner described above, the gate voltage Vgate rises following the rise of EOS voltage applied to the connection terminal.

The bipolar transistor 13 formed in the first discharge circuit 10 will be described with reference to FIG. 2 to FIG. 4B.

Figure 2:
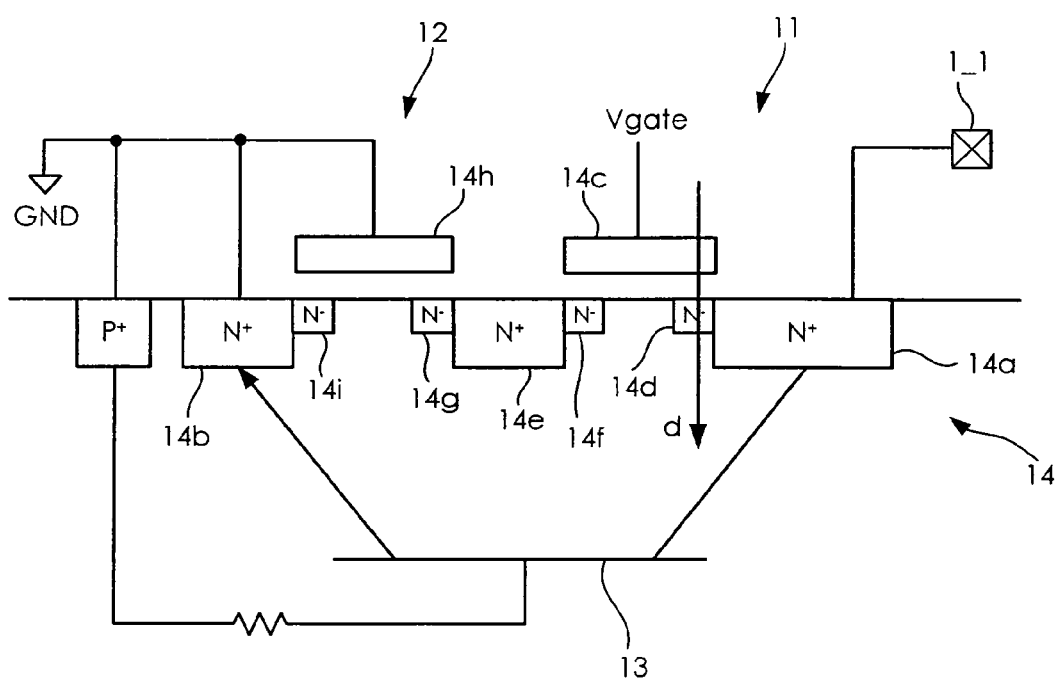
FIG. 2 is a cross-sectional view of an exemplary first discharge circuit illustrated in FIG. 1.

FIG. 2 is a cross-sectional view of the first discharge circuit 10 illustrated in FIG. 1. The first discharge circuit 10 is formed on a P-type surface layer 14 in a semiconductor substrate. The first N-channel MOS transistor 11 is formed with a drain $N^+$ region 14a and source $N^+$ region 14e formed in the surface of the P-type layer 14. The second N-channel MOS transistor 12 is formed with a drain $N^+$ region 14e and source N+ region 14b formed in the surface of the P-type layer 14. That is, the $N^+$ region 14e is shared as a source and a drain region of the first and second N-channel MOS transistors 11 and 12.

As illustrated in FIG. 2, under a gate electrode 14c of the first N-channel MOS transistor 11, an $N^-$ region 14d is formed next to the drain $N^+$ region 14a of the first N-channel MOS transistor 11. Additionally, $N^-$ regions 14f and 14g are formed next to both ends of an $N^+$ region 14e. Moreover, under a gate electrode 14h of the second N-channel MOS transistor 12, an $N^-$ region 14i is formed next to the source $N^+$ region 14b of the second N-channel MOS transistor 12.

The bipolar transistor 13 has the drain $N^+$ region 14a of the first N-channel MOS transistor 11 as a collector, the source $N^+$ region 14b of the second N-channel MOS transistor 12 as an emitter, and the P-type layer 14 as a base. With this configuration in which the source and the drain of the first and second N-channel MOS transistors 11 and 12 share the diffusion region in the surface of the P-type layer 14 of the semiconductor substrate, the bipolar transistor 13 illustrated in FIG. 2 is realized.

Figure 3A:
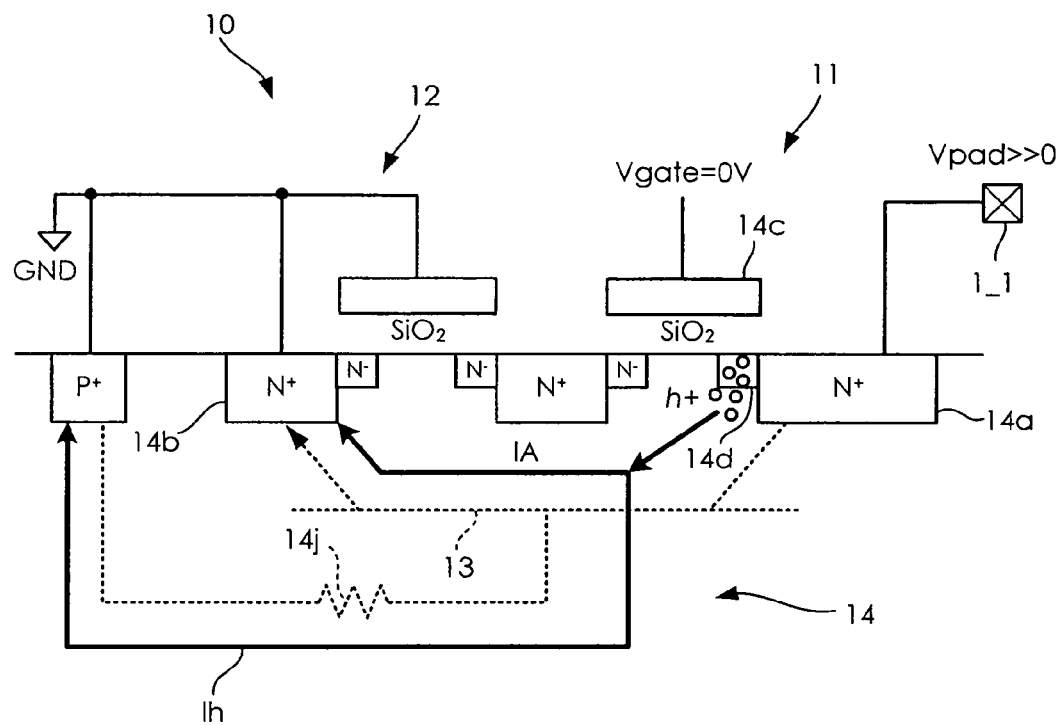
FIG. 3A is a diagram illustrating currents that flow through the exemplary first discharge circuit when a voltage of 0 V is supplied as a gate voltage Vgate.
Figure 3B:
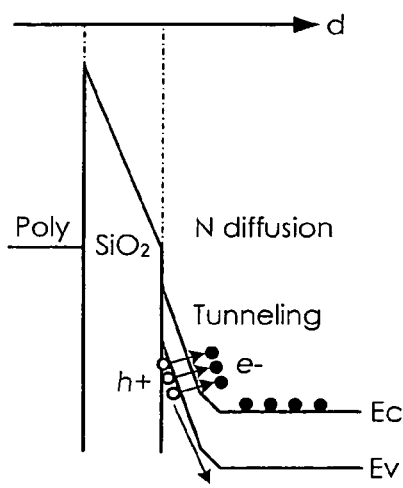
FIG. 3B is the corresponding energy band diagram for a drain N$^-$ region of the first N-channel MOS transistor when the voltage of 0 V is supplied as the gate voltage Vgate.

FIG. 3A is a diagram illustrating currents that flows through the first discharge circuit 10 when a voltage of 0 V is supplied as the gate voltage Vgate. FIG. 3B is a corresponding energy band diagram for the $N^-$ drain region 14d of the first N-channel MOS transistor 11. Specifically, FIG. 3A illustrates two currents Ih and IA that flow through the first discharge circuit 10, and FIG. 3B illustrates energy levels in the depth direction (indicated by an arrow "d" in FIG. 2) in the $N^-$ region 14d. Referring to FIG. 3B, Poly (poly-silicon layer) corresponds to the gate electrode 14c, $SiO_2$ corresponds to a silicon dioxide gate dielectric film, and N diffusion (diffusion layer) corresponds to the $N^-$ region 14d.

FIG. 3A illustrates situation that a voltage of 0V is supplied as the gate voltage Vgate to the gate electrode 14c of the first N-channel MOS transistor 11 and that a large positive pad voltage Vpad is applied through the connection terminal 1_1 (pad) on the drain $N^+$ region 14a of the first N-channel MOS transistor 11. In this situation, as illustrated in FIG. 3B, the valence band Ev and the conduction band Ec bend significantly near the surface of the $N^-$ region 14d. Because the bend narrows a gap between the valence band Ev and the conduction band Ec near the surface of the N⁻ region 14d, electrons e⁻ in the valence band Ev may tunnel to the conduction band Ec. After the tunneling of the electrons e⁻ to the conduction band Ec, holes h⁺ remain in the valence band Ev.

As illustrated in FIG. 3A, a hole current Ih generated by the holes h⁺ flows from the N⁻ region 14d to the P-type layer 14 in the semiconductor substrate. When the hole current Ih flows through a resistance 14j of the P-type layer, a base potential of the bipolar transistor 13 raises and the junction between the base and the emitter of the bipolar transistor 13 is forward biased. The forward bias allows a large current IA to flow from the connection terminal 1_1 to the ground GND.

Thus, when a voltage of 0 V is supplied as the gate voltage Vgate, the tunneling effect facilitates an increase in the base potential of the bipolar transistor 13. As a result, the bipolar transistor 13 easily turned turns on.

Figure 4A:
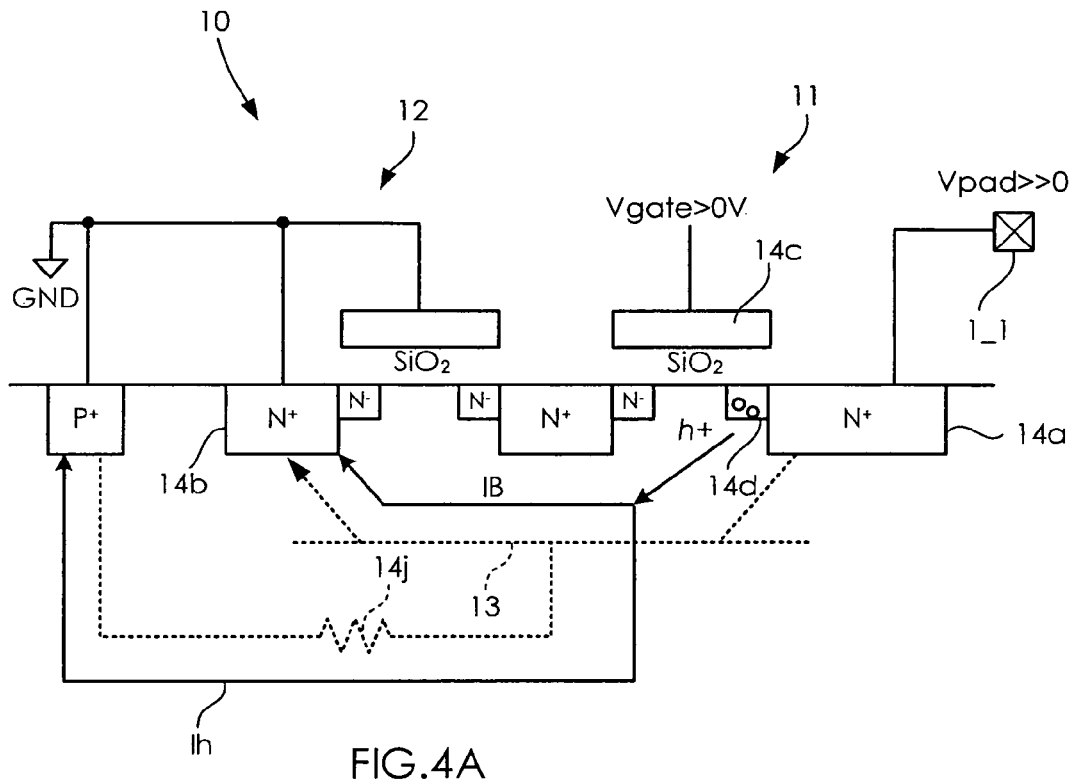
FIG. 4A is a diagram illustrating currents that flow through the first discharge circuit when a voltage greater than 0 V is supplied as the gate voltage Vgate.
Figure 4B:
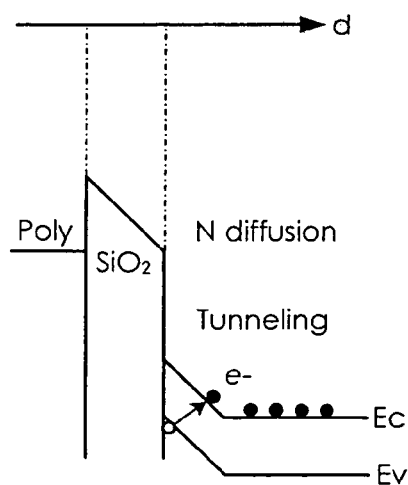
FIG. 4B is the corresponding energy band diagram for the drain N$^-$ region of the first N-channel MOS transistor when the voltage greater than 0 V is supplied as the gate voltage Vgate.

FIG. 4A is a diagram illustrating currents that flow through the first discharge circuit 10 when a voltage greater than 0 V is supplied as the gate voltage Vgate. FIG. 4B is a corresponding energy band diagram for the drain N⁻ region 14d of the first N-channel MOS transistor 11. Specifically, FIG. 4A illustrates two currents Ih and IB that flow through the first discharge circuit 10, and FIG. 4B illustrates energy levels in the depth direction (indicated by the arrow "d" in FIG. 2) in the N⁻ region 14d of the first N-channel MOS transistor 11.

FIG. 4A illustrates a situation that a voltage greater than 0 V is supplied as the gate voltage Vgate to the gate electrode 14c of the first N-channel MOS transistor 11 and that the voltage Vpad greater than the voltage supplied to the gate electrode 14c is applied through the connection terminal 1_1 to the drain N⁺ region 14a. In this situation, as illustrated in FIG. 4B, the valence band Ev and the conduction band Ec of the N⁻ region 14d bend only slightly near the surface of the N⁻ region 14d. In this case, because the gap between the valence band Ev and the conduction band Ec is not narrowed significantly, the tunneling does not easily occur and the generation of holes h⁺ in the N⁻ region 14d is limited. As a result, because the current Ih generated by the holes h⁺ is small, the bipolar transistor 13 is not easily turned on.

To turn on the bipolar transistor 13 and allow a large current IB to flow when the gate voltage Vgate greater than 0 V is supplied, it is necessary to provide a sufficiently large potential difference between the gate voltage Vgate and the pad voltage Vpad. This means that, in order to turn on the bipolar transistor 13, the pad voltage Vpad is needed to be made higher compared to the case of FIG. 3A by the value of the gate voltage Vgate.

That is, a trigger voltage Vpad_on_pos at which the bipolar transistor 13 turns on when the gate voltage Vgate is greater than 0 V (gate voltage Vgate>0 V) is given by:

$$Vpad\_on\_0V + Vgate$$

where Vpad_on_0V is a trigger voltage when the gate voltage Vgate is 0 V (gate voltage Vgate=0 V). Thus, as the gate voltage Vgate increases, the trigger voltage also increases.

Next, a normal operation of the protection circuit 1_2 (see FIG. 1), and operations of the protection circuit 1_2 when EOS is applied and when ESD is applied will be explained.

Figure 5:
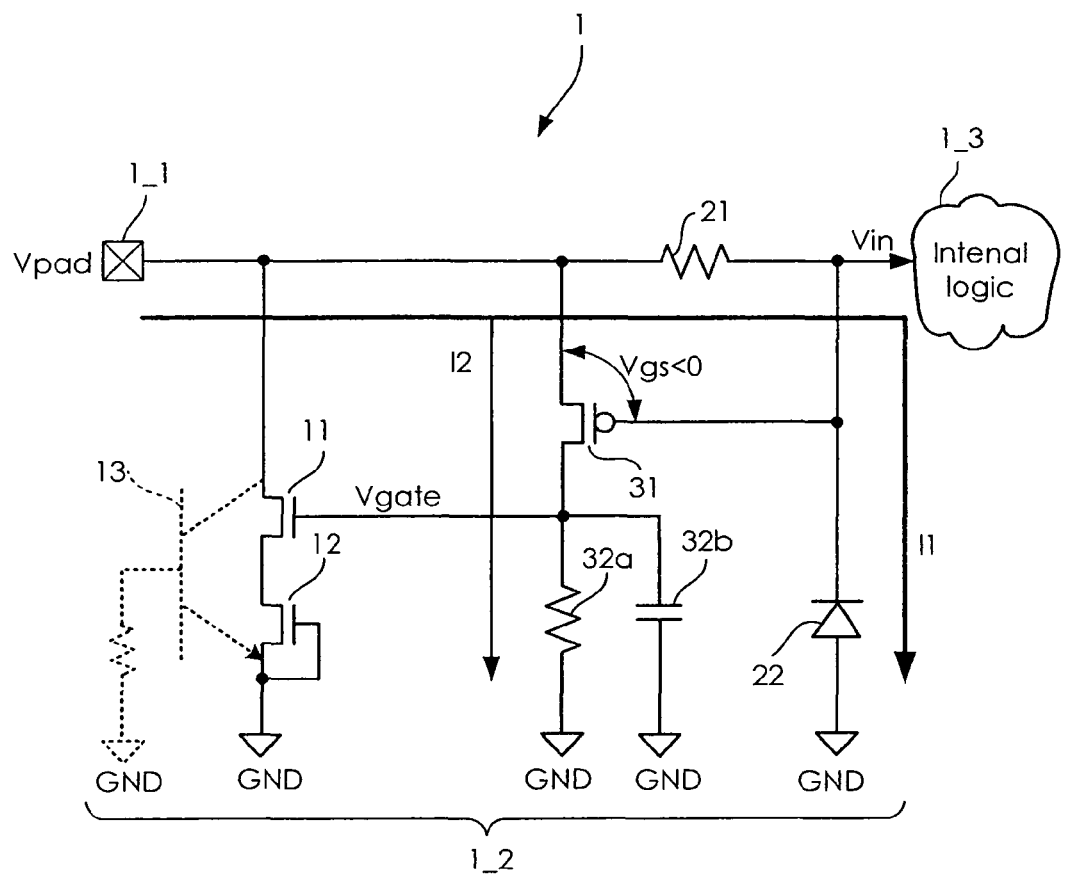
FIG. 5 illustrates paths of currents that flow through a protection circuit when EOS is applied to the exemplary semiconductor integrated circuit illustrated in FIG. 1.
Figure 6:
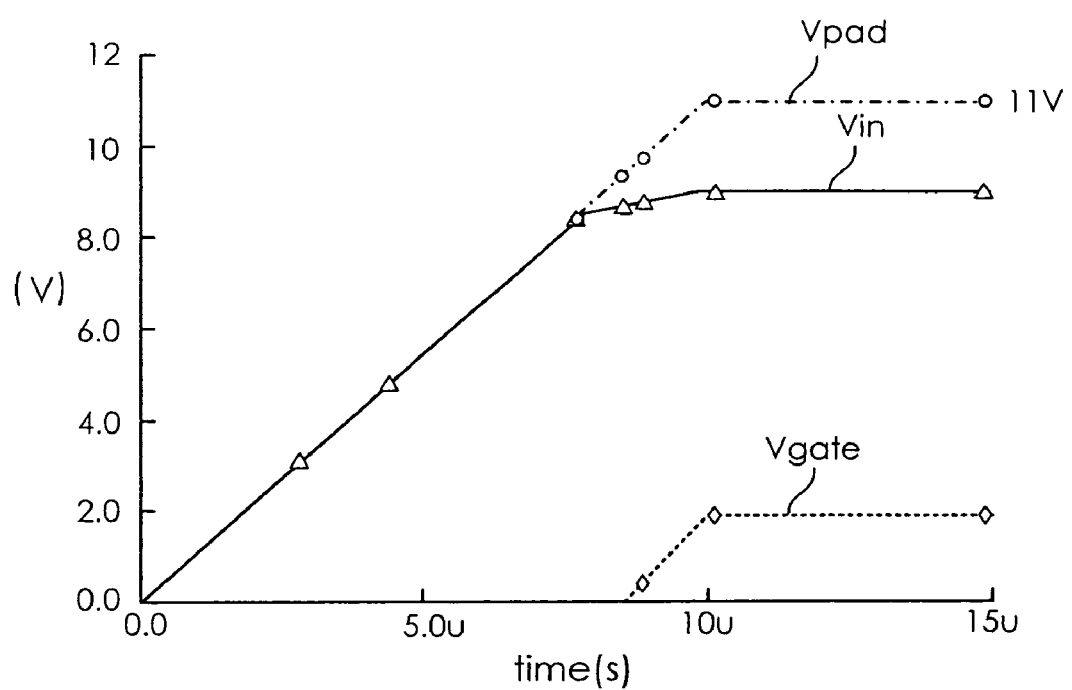
FIG. 6 is a graph showing a potential generated at each node when EOS is applied to the exemplary semiconductor integrated circuit illustrated in FIG. 1.

First, an operation of the protection circuit 1_2 when EOS is applied will be described with reference to FIG. 5 and FIG. 6. FIG. 5 illustrates paths of currents that flow through the protection circuit 1_2 when EOS is applied to the exemplary semiconductor integrated circuit 1 illustrated in FIG. 1. FIG. 6 is a graph showing a potential at each node of the exemplary semiconductor integrated circuit 1 illustrated in FIG. 5.

Note that a voltage at which the second discharge circuit 20 operates is lower than a voltage at which the first discharge circuit 10 operates when no over-voltage detect signal is supplied from the over-voltage detect circuit 30. Specifically, the diode 22 included in the second discharge circuit 20 turns on (or breaks down) at a reverse bias voltage of, for example, 8.5 V. The bipolar transistor 13 included in the first discharge circuit 10 turns on when a potential difference between the pad voltage Vpad and the gate voltage Vgate (Vpad−Vgate) becomes, for example, 10 V or more.

Referring to FIG. 5, EOS that rises from 0 V to 11 V in 10 µs (as shown in FIG. 6) is applied as the pad voltage Vpad to the connection terminal 1_1 of the exemplary semiconductor integrated circuit 1. The EOS is applied to the exemplary semiconductor integrated circuit 1 to which the power-supply voltage is not supplied. Before the EOS voltage reaches to the operation voltage of the second discharge circuit 20, the pad voltage Vpad and a gate voltage Vin of the P-channel MOS transistor 31 are at the same value. Accordingly, the P-channel MOS transistor 31 is in the OFF state, and the gate voltage Vgate of the first N-channel MOS transistor 11 remains at 0 V.

When the pad voltage Vpad exceeds the breakdown voltage of the diode 22 of 8.5 V, a current I1 flows through the diode 22. This current I1 generates a negative voltage Vgs between the gate and the source of the P-channel MOS transistor 31. When the voltage Vgs reaches to or exceeds the threshold voltage of the P-channel MOS transistor 31, the P-channel MOS transistor 31 turns ON. As a result, a current I2 flows through a path including the P-channel MOS transistor 31 and the resistor 32a to the ground GND. Because the time constant defined by the resistor 32a and the capacitor 32b is set to be smaller than the rise time of EOS, the gate voltage Vgate follows the increase of the pad voltage. That is, the gate voltage increases as the pad voltage increases.

Therefore, even if the pad voltage Vpad reaches to, for example, 11 V, the potential difference between the pad voltage Vpad and the gate voltage Vgate (Vpad−Vgate) reaches only to 9.4 V. In other words, the potential difference does not exceed the operation voltage of the first discharge circuit 10 of, for example, 10 V. Thus, the bipolar transistor 13 does not turn on, and is not damaged when EOS is applied.

Figure 7:
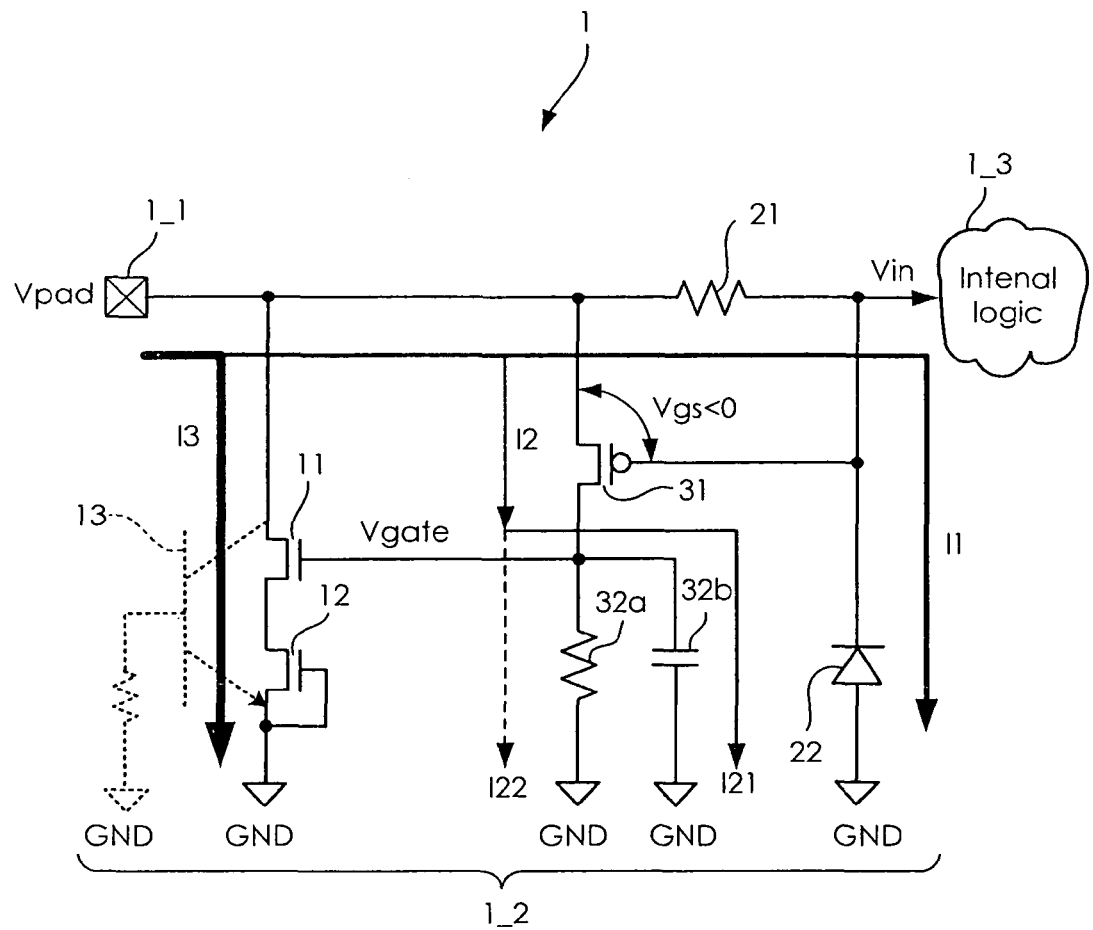
FIG. 7 illustrates paths of currents that flow through the protection circuit when ESD is applied to the exemplary semiconductor integrated circuit illustrated in FIG. 1.
Figure 8:
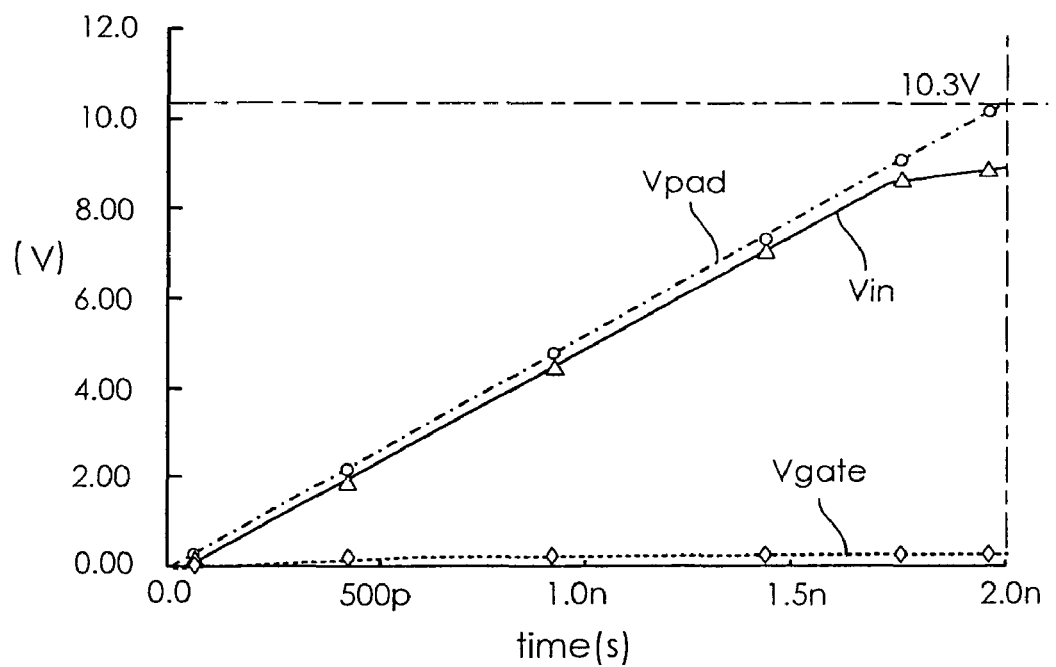
FIG. 8 is a graph showing a potential generated at each node when ESD is applied to the exemplary semiconductor integrated circuit illustrated in FIG. 1.

Next, an operation of the protection circuit 1_2 when ESD is applied will be described with reference to FIG. 7 and FIG. 8. FIG. 7 illustrates paths of currents that flow through the protection circuit 1_2 when ESD is applied to the exemplary semiconductor integrated circuit 1 illustrated in FIG. 1. FIG. 8 is a graph showing a potential at each node of the exemplary semiconductor integrated circuit 1 illustrated in FIG. 7.

Referring to FIG. 7, ESD that rises in a very short period of time is applied as the pad voltage Vpad to the connection terminal 1_1 of the exemplary semiconductor integrated circuit 1. In the example shown in FIG. 8, the pad voltage Vpad rises to 10.3 V, which is higher than the operation voltage of the second discharge circuit, in a period of 2 ns. Accordingly, the diode 22 turns on and the current I2 flows through the P-channel MOS transistor 31.

However, because the time constant of the time-constant circuit 32 is set to be greater than the rise time of ESD, the gate voltage Vgate does not rise, or follow the rise of the pad voltage, immediately. For example, as shown in FIG. 8, the gate voltage Vgate stays approximately at 0 V during the rise of the pad voltage.

As a result, before the gate voltage Vgate fully rises, the potential difference between the pad voltage Vpad and the gate voltage Vgate (Vpad−Vgate) reaches 10 V, which is the operation voltage of the first discharge circuit, in t<2 ns. The bipolar transistor 13 turns on when the potential difference reaches the operation voltage, and moves into a low resistance state because of a positive feedback. As a result, a large current flows through the bipolar transistor 13, and the internal logic 1_3 can be prevented from being damaged.

If the time constant of the time-constant circuit 32 formed by the resistor 32a and the capacitor 32b is too long, the first discharge circuit 10 may be damaged when EOS is applied. If the time constant is too short, the first discharge circuit 10 may not operate when ESD is applied and the internal logic 1_3 may be damaged. Therefore, it is necessary set the time constant of the time-constant circuit 32 appropriately, i.e., longer than the rise time of ESD and shorter than the rise time of EOS.

However, for example, if the second discharge circuit 20 is one that operates after a lapse of a delay time longer than the rise time of ESD, it is possible to construct the protection circuit 1_2 without providing any time-constant circuit. In this case, the over-voltage detect circuit 30 supplies an over-voltage detect signal to the first discharge circuit 10 immediately after the second discharge circuit 20 starts to operate, i.e., after a lapse of the delay time of the second discharge circuit.

Next, a normal operation of the protection circuit 1_2 will be described.

In the normal operation, the internal logic 1_3 operates with a power-supply voltage of, for example, 3.3V. Accordingly, a voltage from 3.3 V to 0 V is supplied as the pad voltage Vpad to the connection terminal 1_1 of the exemplary semiconductor integrated circuit 1. Because the diode 22 does not turn on (or does not break down) at the voltage of 3.3 V, a voltage drop across the resistor 21 is not developed and the current I2 does not flow through the P-channel MOS transistor 31. Therefore, the gate voltage Vgate is maintained at 0 V. However, because the pad voltage Vpad is 3.3 V or less, the bipolar transistor 13 stays in the OFF state and the protection circuit 1_2 does not affect the normal operation of the exemplary semiconductor integrated circuit 1.

Next, another exemplary semiconductor integrated circuit according to a second exemplary embodiment of this disclosure will be described.

Figure 9:
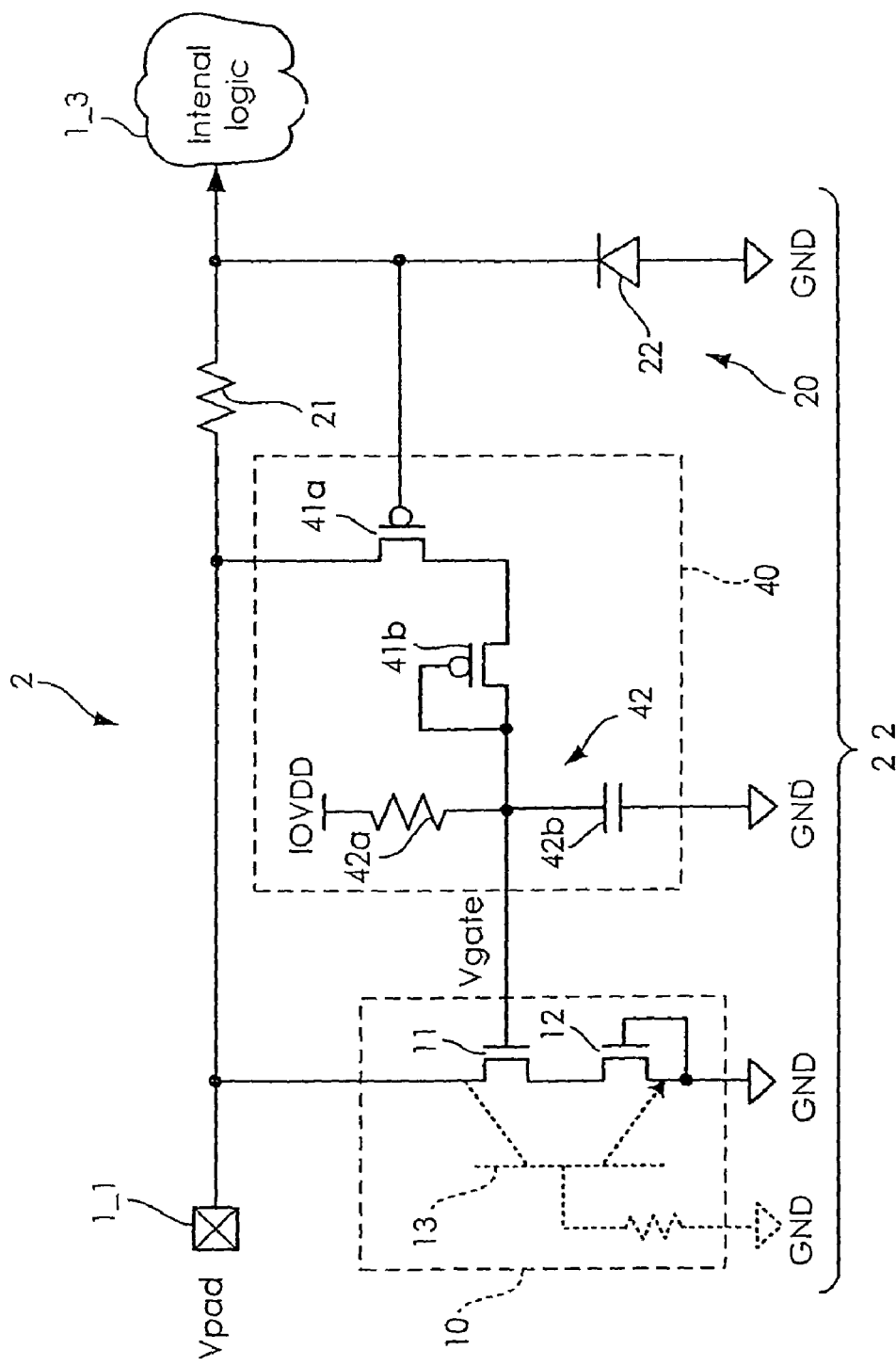
FIG. 9 illustrates a configuration of an exemplary semiconductor integrated circuit according to a second exemplary embodiment of this disclosure.

FIG. 9 illustrates a configuration of an exemplary semiconductor integrated circuit 2 according to the second exemplary embodiment of this disclosure. Note that elements equivalent to those of the exemplary semiconductor integrated circuit 1 illustrated in FIG. 1 are given the same reference numerals and only the differences will be described.

The exemplary semiconductor integrated circuit 2 illustrated in FIG. 9 includes a protection circuit 2_2. The protection circuit 2_2 includes an over-voltage detect circuit 40, instead of the over-voltage detect circuit 30 included in the protection circuit 1_2 of the exemplary semiconductor integrated circuit 1 illustrated in FIG. 1. The over-voltage detect circuit 40 may include two P-channel MOS transistors 41a and 41b connected in series between the connection terminal 1_1 and the gate of the first N-channel MOS transistor 11 of the first discharge circuit 10. The over-voltage detect circuit 40 further includes a time-constant circuit 42, which includes a resistor 42a and a capacitor 42b.

The resistor 42a is connected between the gate of the first N-channel MOS transistor 11 and a high-potential power line. The high-potential power line supplies a power supply voltage IOVDD having a potential higher than that of the ground GND during the normal operation. The capacitor 42b is connected between the gate of the first N-channel MOS transistor 11 and the ground GND. The time constant of the time-constant circuit 42 determined by the resistor 42a and the capacitor 42b is set to be greater than the rise time of ESD and smaller than the rise time of EOS.

A description will be given of a normal operation of the protection circuit 2_2, and operations of the protection circuit 2_2 when EOS is applied and when ESD is applied.

Figure 10:
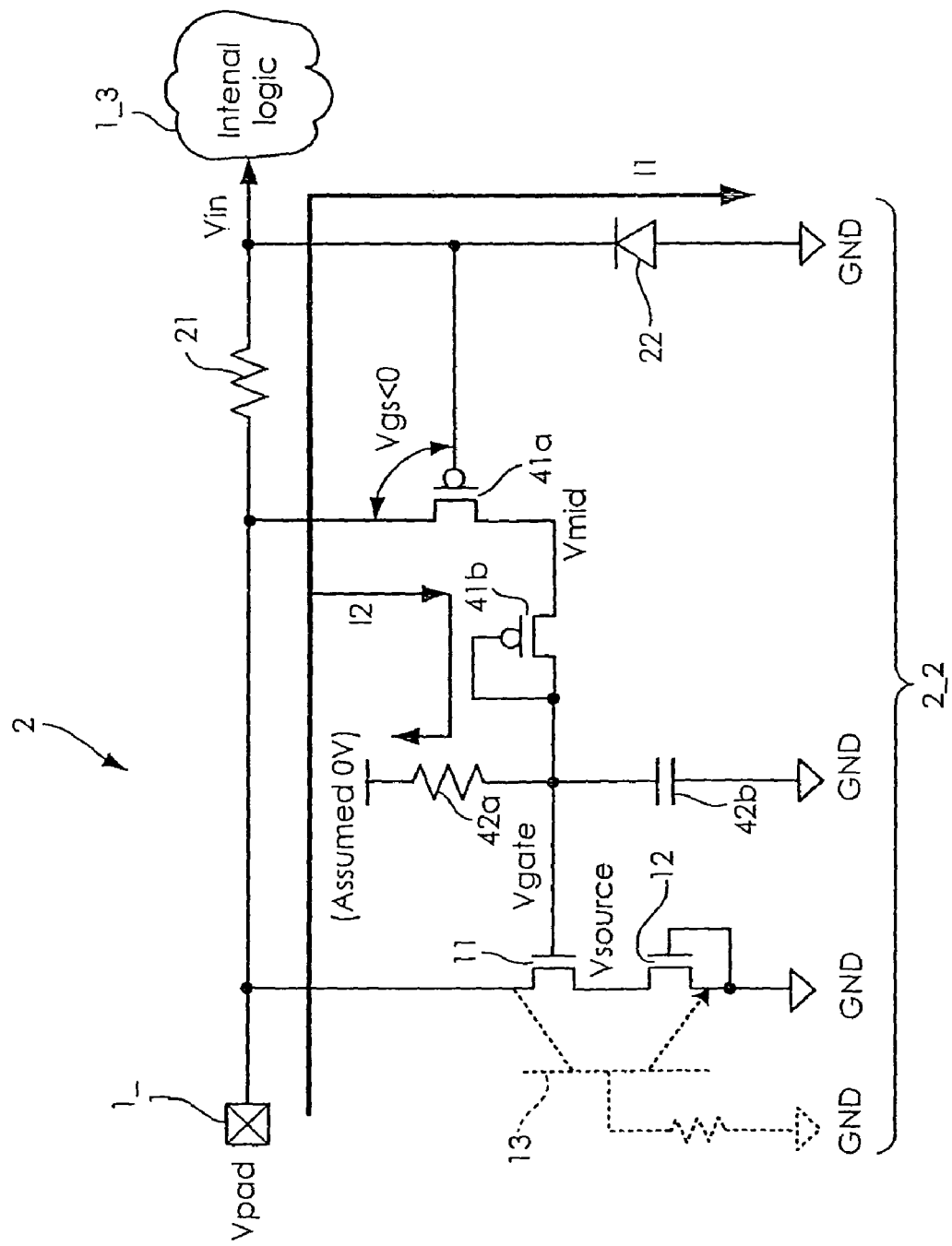
FIG. 10 illustrates paths of currents that flow through a protection circuit when EOS is applied to the exemplary semiconductor integrated circuit illustrated in FIG. 9.
Figure 11:
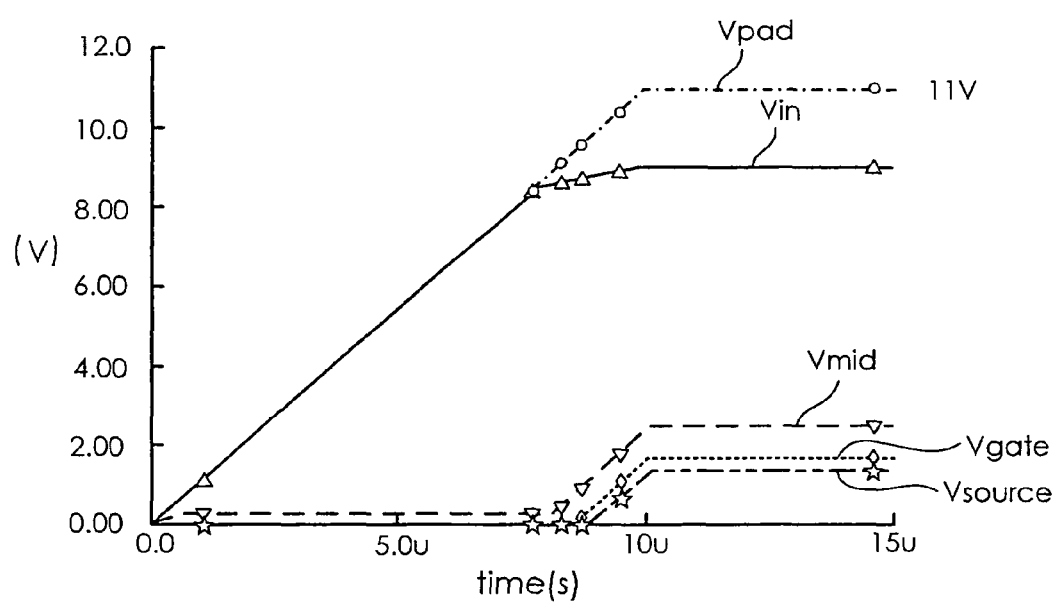
FIG. 11 is a graph showing a potential generated at each node when EOS is applied to the exemplary semiconductor integrated circuit illustrated in FIG. 9.

First, an operation performed in the protection circuit 2_2 when EOS is applied will be described with reference to FIG. 10 and FIG. 11. FIG. 10 illustrates paths of currents that flow through the protection circuit 2_2 when EOS is applied to the exemplary semiconductor integrated circuit 2 illustrated in FIG. 9. FIG. 11 is a graph showing a potential at each node of the exemplary semiconductor integrated circuit 2 illustrated in FIG. 10.

The power supply voltage IOVDD supplied to the resistor 42a illustrated in FIG. 10 is assumed to be 0 V (GND potential), which is the worst condition that causes the bipolar transistor 13 to be turned on. That is, it is assumed that the resistor 42a and the capacitor 42b are connected in parallel between the gate of the first N-channel MOS transistor 11 and the GND potential.

Referring to FIG. 10, EOS that rises from 0 V to 11 V in, for example, 10 µs (as shown in FIG. 11) is applied as the pad voltage Vpad to the connection terminal 1_1 of the exemplary semiconductor integrated circuit 2. When the pad voltage Vpad exceeds the breakdown voltage of the diode 22 of, for example, 8.5 V, the current I1 flows through the diode 22. This current I1 generates a negative voltage Vgs between the gate and the source of the P-channel MOS transistor 41a. When the voltage Vgs reaches to or exceeds the threshold voltage of the P-channel MOS transistor 41a, the P-channel MOS transistor 41a turns on. As a result, a current I2 flows through the path including the P-channel MOS transistor 41a, the P-channel MOS transistor 41b, and the resistor 42a to the high-potential power line.

This current I2 generates a voltage Vmid at a connection point between the P-channel MOS transistor 41a and the P-channel MOS transistor 41b of, for example, 2.5 V, and the gate voltage Vgate of, for example, 1.5 V. Therefore, even if the pad voltage Vpad rises to 11 V, the potential difference between the pad voltage Vpad and the gate voltage Vgate (Vpad−Vgate) reaches only to 9.5 V. Accordingly, the bipolar transistor 13 does not turn on.

Figure 12:
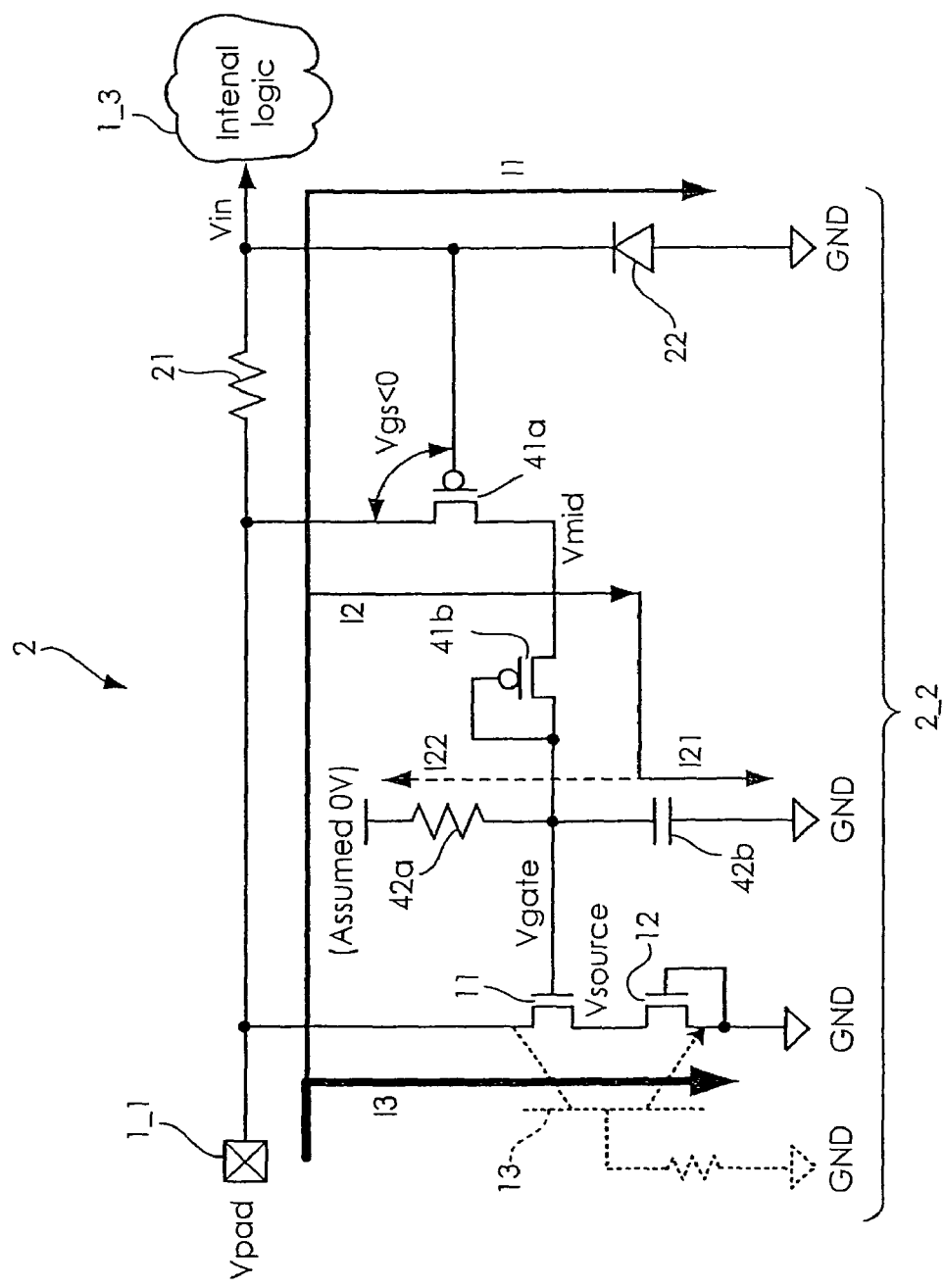
FIG. 12 illustrates paths of currents that flow through the protection circuit when ESD is applied to the exemplary semiconductor integrated circuit illustrated in FIG. 9.
Figure 13:
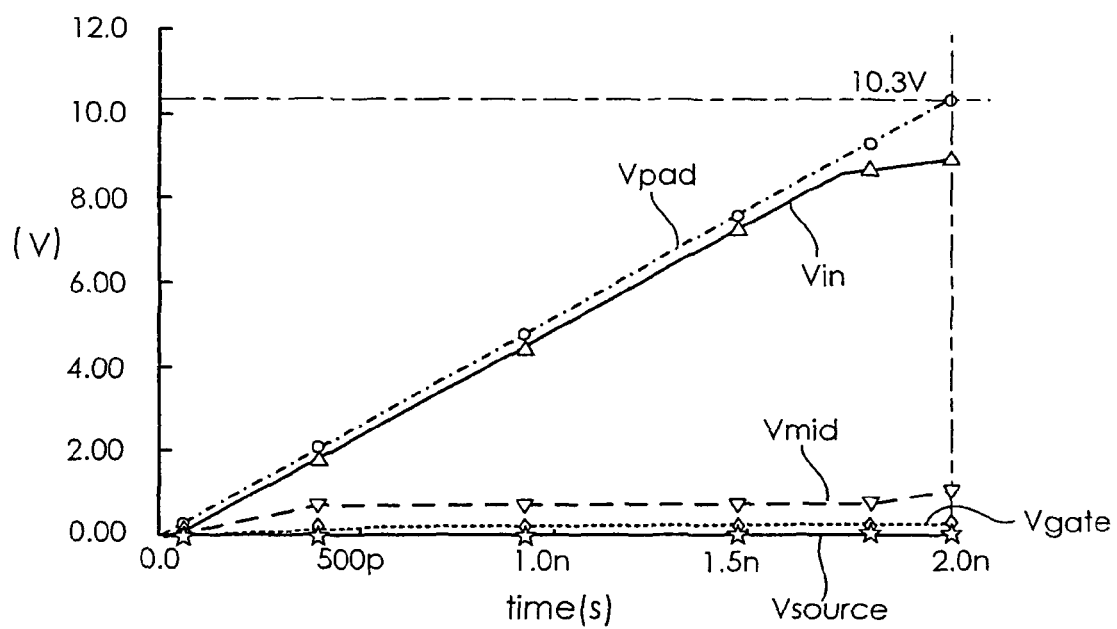
FIG. 13 is a graph showing a potential generated at each node when ESD is applied to the exemplary semiconductor integrated circuit illustrated in FIG. 9.
Figure 14:
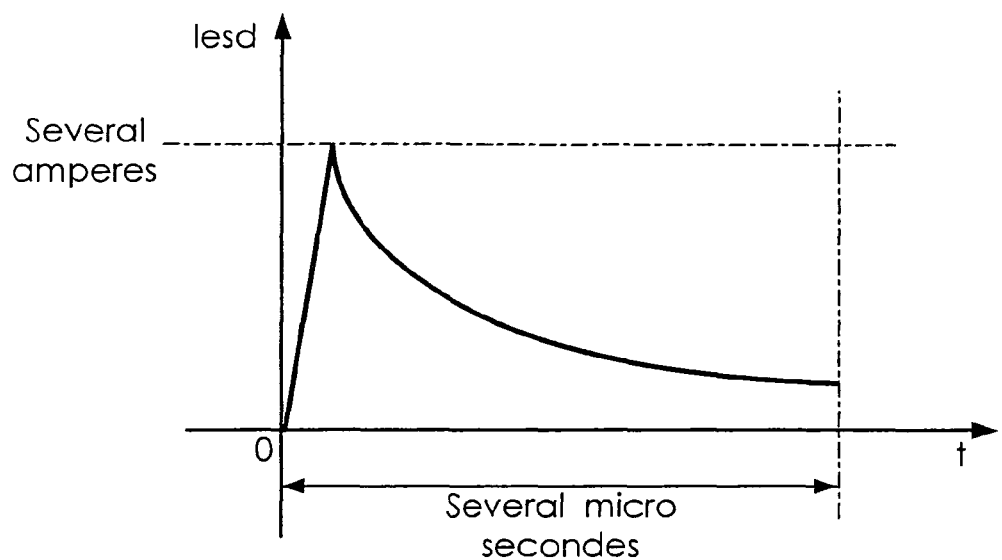
FIG. 14 shows a waveform of a surge current generated when ESD is applied.
Figure 15:
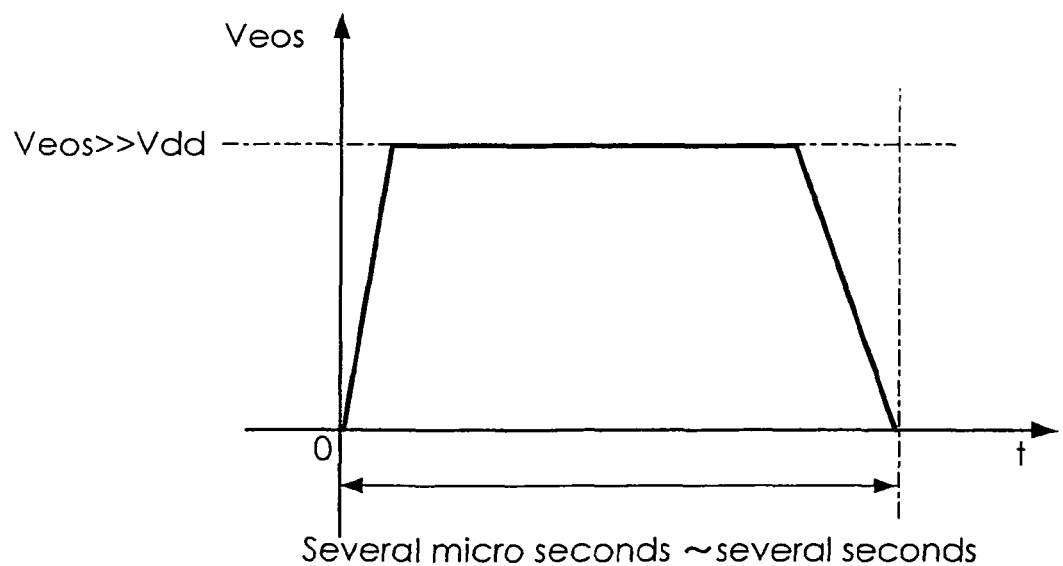
FIG. 15 shows a waveform of an over-voltage generated when EOS is applied.
Figure 16:
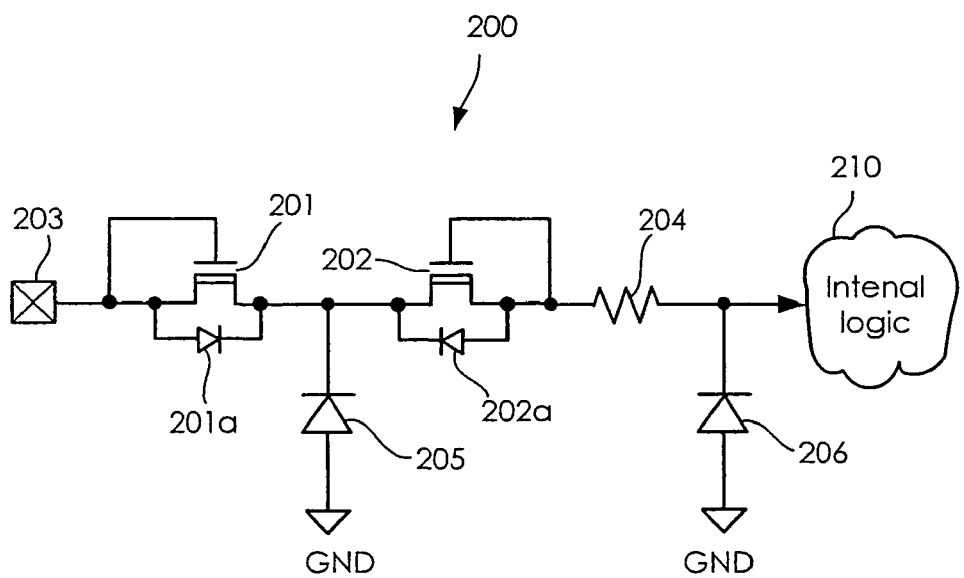
FIG. 16 is a diagram illustrating an ESD/EOS protection circuit proposed in Patent Document 1.
Figure 17:
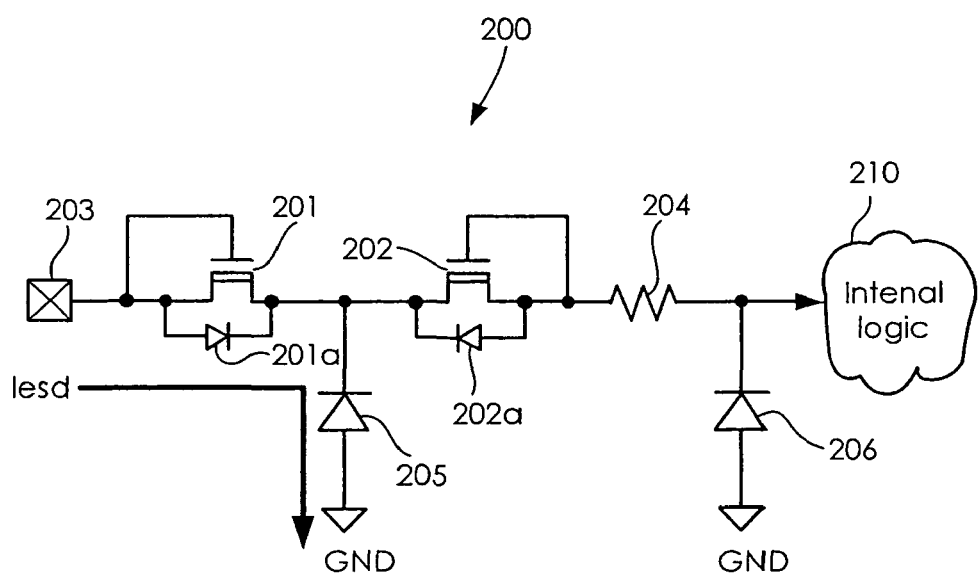
FIG. 17 is a diagram for describing an operation performed in the ESD/EOS protection circuit of FIG. 16 when ESD is applied.
Figure 18:
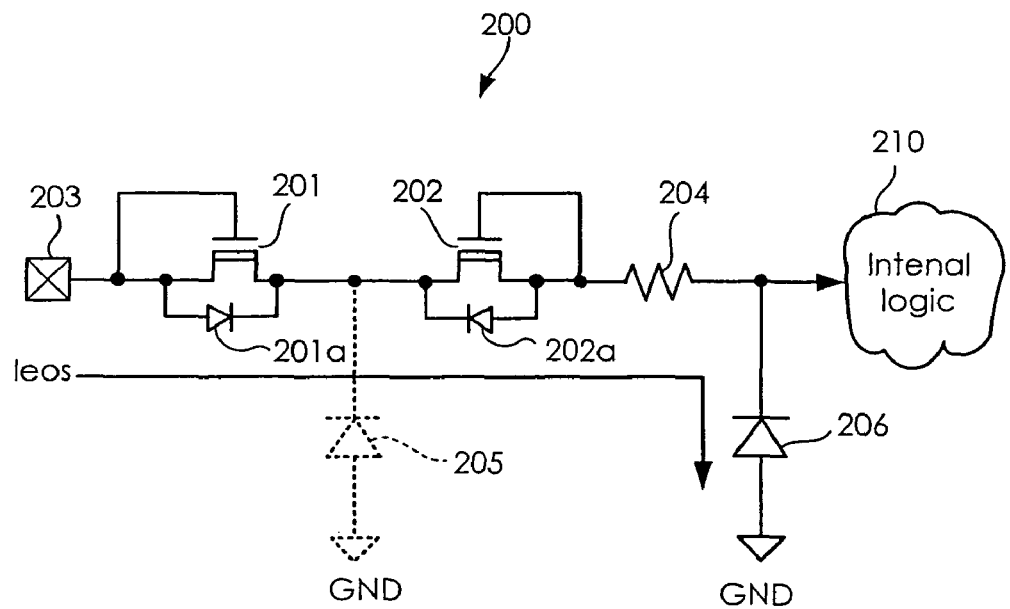
FIG. 18 is a diagram for describing an operation performed in the ESD/EOS protection circuit of FIG. 16 when EOS is applied.
Figure 19:
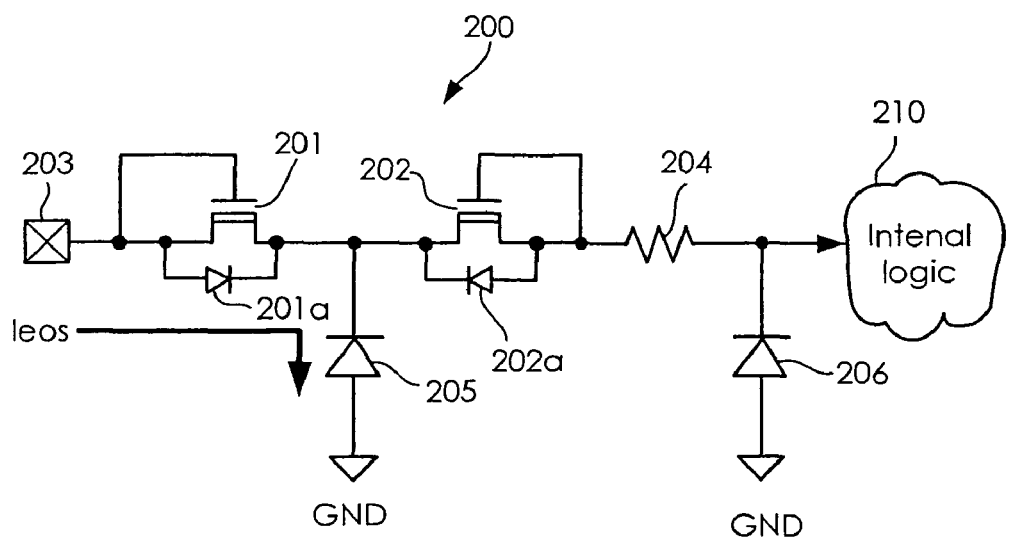
FIG. 19 is a diagram for describing an operation performed in the ESD/EOS protection circuit of FIG. 16 when an EOS voltage greater than a breakdown voltage of a first diode is applied.

Next, an operation performed in the protection circuit 2_2 when ESD is applied will be described with reference to FIG. 12 and FIG. 13. FIG. 12 illustrates paths of currents that flow through the protection circuit 2_2 when ESD is applied to the exemplary semiconductor integrated circuit 2 illustrated in FIG. 9. FIG. 13 is a graph showing a potential at each node of the exemplary semiconductor integrated circuit 2 illustrated in FIG. 12.

Referring to FIG. 12, ESD that rises in a very short period of time is applied as the pad voltage Vpad to the connection terminal 1_1 of the exemplary semiconductor integrated circuit 2. In the example shown in FIG. 13, the pad voltage Vpad rises to 10.3 V, which is higher than the operation voltage of the second discharge circuit, in a period of 2 ns. Accordingly, the diode 22 turns on (or breaks down) to allow the current I1 to flow therethrough. This current I1 generates a negative voltage Vgs between the gate and the source of the P-channel MOS transistor 41a.

When the voltage Vgs reaches to or exceeds the threshold voltage of the P-channel MOS transistor 41a, the P-channel MOS transistor 41a turns on. Accordingly, a current I2 flows through the path including the P-channel MOS transistor 41a and the P-channel MOS transistor 41b. However, because the time constant of the time-constant circuit 42 determined by the capacitor 42b and the resistor 42a is greater than the rise time of ESD, the gate voltage Vgate does not rise immediately.

As a result, before the gate voltage Vgate fully rises, the potential difference between the pad voltage Vpad and the gate voltage Vgate (Vpad−Vgate) reaches 10 V, which is the operation voltage of the first discharge circuit, in t<2 ns. The bipolar transistor 13 turns on when the potential difference reaches the operation voltage, and moves into a low resistance state because of a positive feedback. It is thus possible to allow a large current to flow, and to prevent damaging the internal logic 1_3.

Next, a normal operation of the protection circuit 2_2 will be described.

The power supply voltage IOVDD is, for example, 3.3 V. As the pad voltage Vpad, an "H" level signal (5 V) and an "L" level signal (0 V) are alternately supplied from an external circuit. When the "H" level signal (5 V) is supplied as the pad voltage Vpad to the connection terminal 1_1, the diode 22 does not turn on (or does not break down) because the "H" level signal is lower than the breakdown voltage of the diode 22. As a result, no voltage drop across the resistor 21 is generated. The voltage Vgs between the gate and source of the P-channel MOS transistor 41a remains at 0 V, and the P-channel MOS transistor 41a remains in the OFF state. Accordingly, no leakage current flows through the P-channel MOS transistor 41a. In each transistor, the potential differences between its gate, source, and drain are less than or equal to 3.3 V, and does not exceed the withstand voltage of the device.

When the "L" level signal (0 V) is supplied as the pad voltage Vpad to the connection terminal 1_1, the diode 22 is still in the OFF state. Because the gate and source of the P-channel MOS transistor 41b are connected together and the voltage at the gate is 3.3 V, the P-channel MOS transistor 41b is in the OFF state. Accordingly, no leakage current flows through the P-channel MOS transistor 41b.

In the first exemplary embodiment, the time-constant circuit 32 includes the resistor 32a and the capacitor 32b as described above. In the second exemplary embodiment, the time-constant circuit 42 includes the resistor 42a and the capacitor 42b. However, as long as a capacitance necessary for setting the time constant can be realized by a parasitic capacitance of, for example, the gate of the P-channel MOS transistor 31, it is not necessary to provide the capacitor 32b or 42b as an element of the time-constant circuit 32 or 42.

The second exemplary embodiment is effective when it is desired to receive an external signal having a voltage greater than the power supply voltage IOVDD without damaging the device. Specifically, because the gate of the first N-channel MOS transistor 11 is kept at IOVDD during normal operations, the first N-channel MOS transistor 11 is not damaged by the external signal. On the other hand, the first exemplary embodiment can only receive an external signal having the same voltage as the power supply voltage, because the gate of the first N-channel MOS transistor is kept at 0 V during normal operations.

In the second exemplary embodiment, during normal operations, the gate voltage Vgate of the first N-channel MOS transistor 11 is at the level of IOVDD. Therefore, the gate of the second N-channel MOS transistor 12 should be kept at a level (e.g., GND level) where no leakage current is generated. On the other hand, in the first exemplary embodiment, because the gate of the first N-channel MOS transistor 11 is kept at the GND level during normal operations, the gate voltage of the second N-channel MOS transistor 12 can be set to an arbitrary level.

In the first and second exemplary embodiments described above, the gate of the second N-channel MOS transistor 12 is connected to the source (GND) and the gate of the first N-channel MOS transistor 11 is controlled by the over-voltage detect circuit. It is possible to modify the protection circuit such that, in the normal operation, gates of the first and the second N-channel MOS transistor are controlled by signals supplied from the internal logic 1_3. Thereby, the first and the second N-channel MOS transistors 11 and 12 of the first discharge circuit may be utilized as output transistors in the normal operation.

For example, the gate of the second N-channel MOS transistor 12 may be connected to the internal logic 1_3 without connecting to the source (GND). The gate of the first N-channel MOS transistor may receive a signal from the internal logic 1_3 in addition to the over-voltage detect signal.

In this case, when power-supply voltages for performing normal operations is not supplied to the internal logic 1_3, the gate of the second N-channel MOS transistor 12 connected to the internal logic 1_3 is fixed at the GND level. Further, the gate of the first N-channel MOS transistor 11 is controlled only by the over-voltage detect circuit. Accordingly, when ESD or EOS is applied to the connection terminal, the first and the second N-channel MOS transistors operate same as the first discharge circuit in the first and the second exemplary embodiments.

The first discharge circuit 10, which includes the cascaded N-channel MOS transistors 11 and 12 in the first and second exemplary embodiments described above, may be realized by another configuration. For example, the first discharge circuit 10 may include a thyristor-type discharge device in addition to the cascaded N-channel MOS transistors. The cascaded N-channel MOS transistors may be utilized to generate a trigger current for triggering the thyristor-type device to allow a current to flow.

Also, in the first and second exemplary embodiments described above, the diode 22 serves as a discharge device in the second discharge circuit 20. Alternatively, a circuit where an N-channel MOS transistor, instead of a diode, serves as a discharge device may be used. The drain of the N-channel MOS transistor may be connected to the input terminal of the internal logic 1_3, and the gate and source of the N-channel MOS transistor may be connected to the GND power line.

Further, a resistor for current detection may be inserted between the cathode of the diode 22 and the input terminal of the internal logic 1_3.

What is claimed is:

1. A semiconductor integrated circuit, comprising:
    an internal circuit having an input terminal connected to a connection terminal;
    a protection circuit that discharges an over-voltage supplied to the connection terminal, which is higher than an operation voltage of the internal circuit, to a power line, the protection circuit including:
        a first discharge circuit connected to the connection terminal;
        a second discharge circuit connected to the connection terminal and discharges the over-voltage to the power line; and
        an over-voltage detect circuit that detects a discharge current flowing through the second discharge circuit and generates an over-voltage detect signal to be supplied to the first discharge circuit when the discharge current is detected,
    wherein the first discharge circuit, which discharges the over-voltage when the over-voltage detect signal is not supplied, is disabled to discharge the over-voltage when the over-voltage detect signal is supplied.

2. The semiconductor integrated circuit of claim 1, wherein the second discharge circuit includes a first resistor, through which the input terminal of the internal circuit is connected to the connection terminal, and a discharge device connected between the input terminal of the internal circuit and the power line.

3. The semiconductor integrated circuit of claim 2, wherein the discharge device includes a diode having a cathode terminal connected to the input terminal of the internal circuit and an anode terminal connects to the power line.

4. The semiconductor integrated circuit of claims 1, wherein the first discharge circuit includes:
   a first N-channel MOS Transistor having a drain connected to the connection terminal and a gate supplied with the over-voltage detect signal; and
   a second N-channel MOS Transistor having a drain connected to a source of the first N-channel MOS transistor, a gate supplied with a fixed voltage, and source connected a source to the power line.

5. The semiconductor integrated circuit of claim 4, wherein:
   the first and the second N-channel MOS transistor are formed with a shared N-type diffusion region in a surface of a P-type layer in a surface of a semiconductor substrate, the shared N-type diffusion region forms the source of the first N-channel MOS transistor and the drain of the second N-channel MOS transistor; and
   the first discharge circuit includes a bipolar transistor having:
   a base formed with the P-type layer;
   a collector formed with a first N-type diffusion region in the surface of the P-type layer that forms the drain of the first N-channel MOS transistor; and
   an emitter formed with a second N-type diffusion region in the surface of the P-type layer that forms the source of the second N-channel MOS transistor.

6. A semiconductor integrated circuit, comprising:
   an internal circuit having an input terminal connected to a connection terminal;
   a protection circuit that discharges an over-voltage supplied to the connection terminal, which is higher than an operation voltage of the internal circuit, to a power line, the protection circuit including:
      a first discharge circuit connected to the connection terminal;
      a second discharge circuit connected to the connection terminal and discharges the over-voltage to the power line; and
      an over-voltage detect circuit that detects a discharge current flowing through the second discharge circuit and generates an over-voltage detect signal to be supplied to the first discharge circuit when the discharge current is detected, the over-voltage detect circuit including:
         a detect device that detects the discharge current and generates the over-voltage detect signal; and
         a time-constant circuit having a time constant determined by a capacitor and a second resister, the time-constant circuit controls a rising time of the over-voltage detect signal,
      wherein the first discharge circuit, which discharges the over-voltage when the over-voltage detect signal is not supplied, is disabled to discharge the over-voltage when the over-voltage detect signal is supplied.

7. The semiconductor integrated circuit of claim 6, wherein the capacitor includes a parasitic capacitance connected in parallel with the second resistor.

8. The semiconductor integrated circuit of claims 6, wherein:
   the time-constant circuit controls the rising time of the over-voltage detect signal such that, when a first over-voltage having a first duration longer than the rising time of the over-voltage detect signal is supplied to the connection terminal, the first discharge circuit is disabled before the first discharge circuit is damaged by a first discharge current flowing through the first discharge circuit to discharge the first over-voltage.

9. The semiconductor integrated circuit of claim 8, wherein:
   the time-constant circuit controls the rising time of the over-voltage detect signal such that, when a second over-voltage having a second rising time shorter than the rising time of the over-voltage detect circuit is supplied to the connection terminal, the first discharge circuit discharges the second over-voltage.

10. The semiconductor integrated circuit of claim 6, wherein;
    the second discharge circuit includes a first resistor, through which the input terminal of the internal circuit is connected to the connection terminal, and a discharge device connected between the input terminal of the internal circuit and the power line; and
    the detect device includes a P-channel MOS transistor having a source connected to the connection terminal and a gate connected to the input terminal of the internal circuit and a drain that generates the over-voltage detect signal.

11. The semiconductor integrated circuit of claims 6, wherein the first discharge circuit includes:
    a first N-channel MOS Transistor having a drain connected to the connection terminal and a gate supplied with the over-voltage detect signal; and
    a second N-channel MOS Transistor having a drain connected to a source of the first N-channel MOS transistor, a gate supplied with a fixed voltage, and source connected a source to the power line.

12. The semiconductor integrated circuit of claim 8, wherein:
    the first and the second N-channel MOS transistor are formed with a shared N-type diffusion region in a surface of a P-type layer in a surface of a semiconductor substrate, the shared N-type diffusion region forms the source of the first N-channel MOS transistor and the drain of the second N-channel MOS transistor; and
    the first discharge circuit includes a bipolar transistor having:
    a base formed with the P-type layer;
    a collector formed with a first N-type diffusion region in the surface of the P-type layer that forms the drain of the first N-channel MOS transistor; and
    an emitter formed with a second N-type diffusion region in the surface of the P-type layer that forms the source of the second N-channel MOS transistor.

13. A method of protecting a semiconductor integrated circuit from an over-voltage, which is higher than an operation voltage of an internal circuit of the semiconductor integrated circuit, supplied to a connection terminal, the method comprising:
    providing a first discharge circuit connected to the connection terminal;
    providing a second discharge circuit connected to the connection terminal and discharging the over-voltage through the second discharge circuit to a power line;

detecting a discharge current flowing through the second discharge circuit and generating a over-voltage detect signal when the discharge current is detected; and supplying the over-voltage detect signal to the first discharged circuit, which discharges the over-voltage when the over-voltage detect signal is not supplied, and disabling the first discharge circuit to discharge the over-voltage.

14. The method of claim 13, wherein:

the over-voltage includes a first over-voltage having a first rising time and a first duration and a second over voltage having a second rising time shorter than the first rising time and a second duration shorter than the first duration;

the generating of the over-voltage detect signal includes controlling a rising time of the over-voltage detect signal shorter than the first rising time of the first over voltage.

15. The method according to claim 14, wherein:

the generating of the over-voltage detect signal further includes controlling the rising time of the over-voltage detect signal longer than the second rising time of the second over voltage.

* * * * *